United States Patent
Jo

(10) Patent No.: US 7,247,572 B2
(45) Date of Patent: Jul. 24, 2007

(54) METHOD FOR FABRICATING A CAPACITOR USING A METAL INSULATOR METAL STRUCTURE

(75) Inventor: Bo-Yeoun Jo, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 80 days.

(21) Appl. No.: 10/743,573

(22) Filed: Dec. 22, 2003

(65) Prior Publication Data

US 2004/0147085 A1 Jul. 29, 2004

(30) Foreign Application Priority Data

Dec. 24, 2002 (KR) ............... 10-2002-0083531

(51) Int. Cl.
*H01L 21/302* (2006.01)

(52) U.S. Cl. .................. 438/712; 257/E21.214

(58) Field of Classification Search ............ 438/253, 438/396, 712; 257/E21.214
See application file for complete search history.

(56) References Cited

U.S. PATENT DOCUMENTS

| | | | | |
|---|---|---|---|---|
| 5,494,837 A * | 2/1996 | Subramanian et al. | ....... | 438/149 |
| 6,004,884 A * | 12/1999 | Abraham | ............ | 438/714 |
| 6,083,805 A * | 7/2000 | Ouellet et al. | ............ | 438/396 |
| 6,100,201 A * | 8/2000 | Maejima et al. | ............ | 438/706 |
| 6,368,517 B1 * | 4/2002 | Hwang et al. | ............ | 216/67 |
| 6,406,447 B1 | 6/2002 | Thrash et al. | ............ | 361/313 |
| 6,468,858 B1 | 10/2002 | Lou | ............ | 438/253 |
| 6,597,068 B2 | 7/2003 | Petrarca et al. | ............ | 257/752 |
| 6,891,218 B2 * | 5/2005 | Kiyotoshi | ............ | 257/310 |
| 2002/0052077 A1 * | 5/2002 | Tee et al. | ............ | 438/239 |
| 2003/0008467 A1 * | 1/2003 | Kai et al. | ............ | 438/393 |
| 2003/0064590 A1 * | 4/2003 | Hwang | ............ | 438/689 |
| 2003/0068858 A1 * | 4/2003 | Allman et al. | ............ | 438/253 |

* cited by examiner

*Primary Examiner*—Bradley K. Smith
(74) *Attorney, Agent, or Firm*—Andrew D. Fortney

(57) ABSTRACT

A method for fabricating a capacitor using a metal/insulator/metal (MIM) structure is disclosed. An example method for fabricating a capacitor using an MIM structure including a first metal layer, a dielectric layer, and a second metal layer etches the second metal layer and the dielectric layer in order and changes the etching conditions associated with the second metal layer prior to etching the dielectric layer.

14 Claims, 3 Drawing Sheets

METHOD FOR FABRICATING A CAPACITOR USING A METAL INSULATOR METAL STRUCTURE

FIELD OF THE DISCLOSURE

The present disclosure relates to a fabrication method of a semiconductor device and, more particularly, to a method for fabricating a capacitor using a metal insulator metal structure.

BACKGROUND

Capacitors used in a semiconductor device are generally classified as a PIP (poly/insulator/poly) structure or a MIM (metal/insulator/metal) structure. Use of either of the PIP and MIM structures is based on the application in which a capacitor is used. The MIM structure is often used for high frequency semiconductor devices or applications. This is because in the case of a high frequency device undergoing a variation of characteristics due to a RC delay, it is preferable to employ the MIM structure using metals having superior electrical properties.

Conventional techniques for forming capacitors using the MIM structure are disclosed in U.S. Pat. Nos. 6,468,858, 5,406,447 and 6,597,068.

FIG. 1 shows a general MIM structure. As shown in FIG. 1, the MIM structure comprises a first metal layer 11, an insulation line 12 and a second metal layer 13, which are stacked in order. The first metal layer 11 includes two Ti/TiN films and an AlCu film sandwiched between the Ti/TiN films, for example. The second metal layer 13 includes one Ti/TiN film, for example. The insulation film 12 is located between the first and second metal layers and is formed of a nitride film, for example.

A metal reactive ion etching (RIE) process is commonly used to fabricate the capacitor using the above-described MIM structure. However, in this process, nitride residues 14 are roughly or unevenly formed on a surface of the nitride film.

The formation of the rough nitride residues 14 is due to the use of a thin nitride film and the inadequacy of process conditions, which result in small etching margin and application disability of process conditions prominent in removal capacity of nitride.

In addition, the rough nitride residues are not removed in subsequent processes as the property of the nitride film is changed in a metal cleaning process. If etching time is increased to remove the nitride residues, a lower layer may be exposed in a plurality of locations. This causes pattern defects, which is a factor of a pattern short, in a subsequent patterning process. Therefore, there is a practical limit to the amount that the etching time can be increased.

DETAILED DESCRIPTION

The present disclosure describes an example etching process by which a surface of nitride residue can be evened or leveled. The disclosed method may be used to produce a substantially even (e.g., a desired degree of flatness) by changing etching conditions of a Ti/TiN film as an upper metal layer in a reactive ion etching process and etching conditions of a nitride film as a dielectric line such that only the nitride film is effectively removed after the Ti/TiN film is completely removed.

Figure 1:
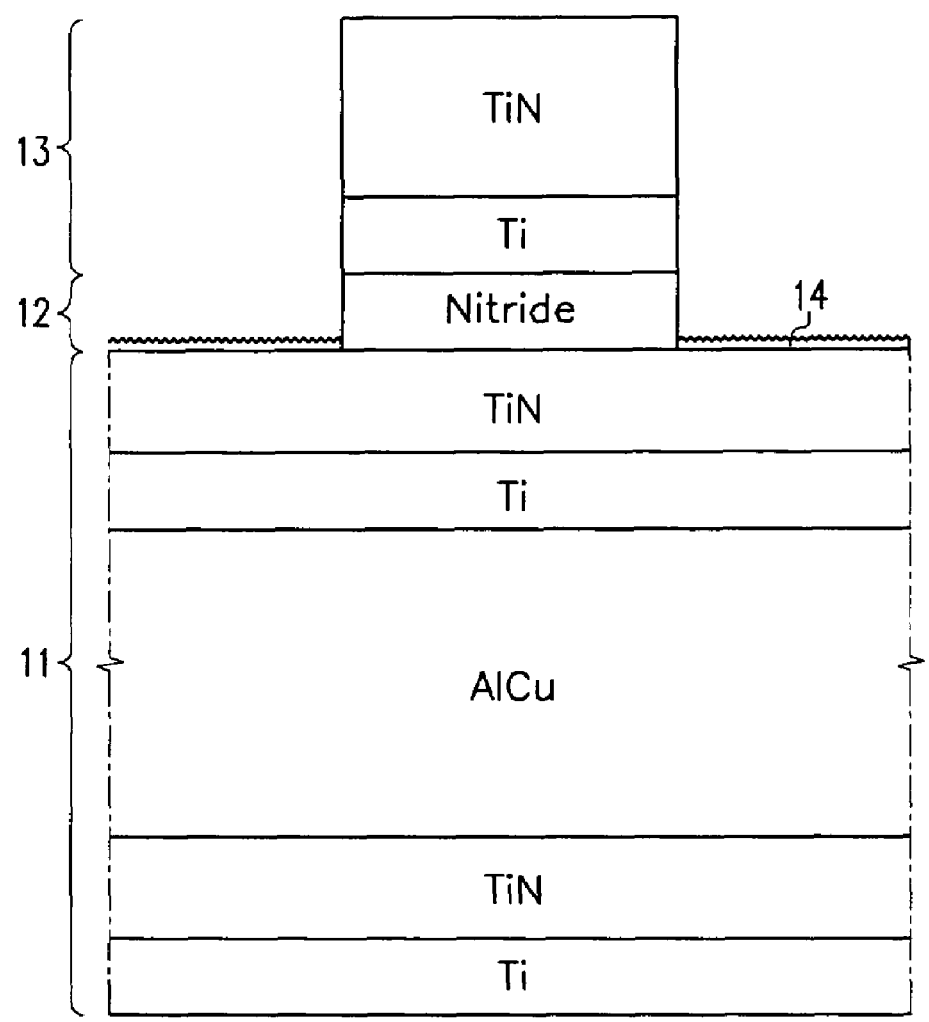
FIG. 1 illustrates an MIM capacitor structure formed by a general etching process.
Figure 2:
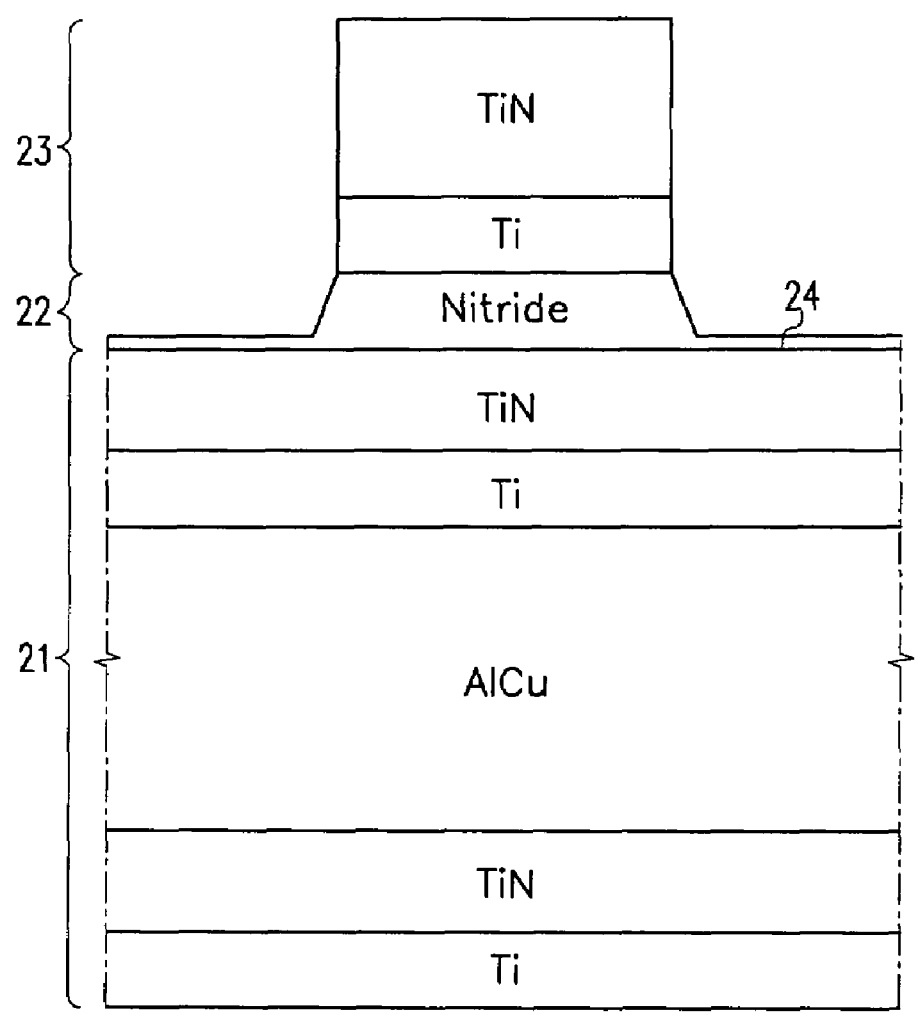
FIG. 2 illustrates an MIM capacitor structure when a nitride film is etched by the example etching process described herein.

FIG. 2 illustrates an MIM capacitor structure when a nitride film is etched by the example etching process described in greater detail herein. As shown in FIG. 2, a first metal layer 21, a dielectric layer 22 and a second metal layer 23 are sequentially stacked to form a capacitor in an MIM structure.

The first metal layer 21 includes two Ti/TiN films and an AlCu film sandwiched between them, for example. The second metal layer 23 includes one Ti/TiN film, for example.

The dielectric layer 22 functioning as a capacitor is made of nitride and is located between the first and second metal layers 21 and 23.

As shown in FIG. 2, a residual film 24 of the dielectric layer 22 formed by the example etching process described herein has a substantially even or flat.

Figure 3:
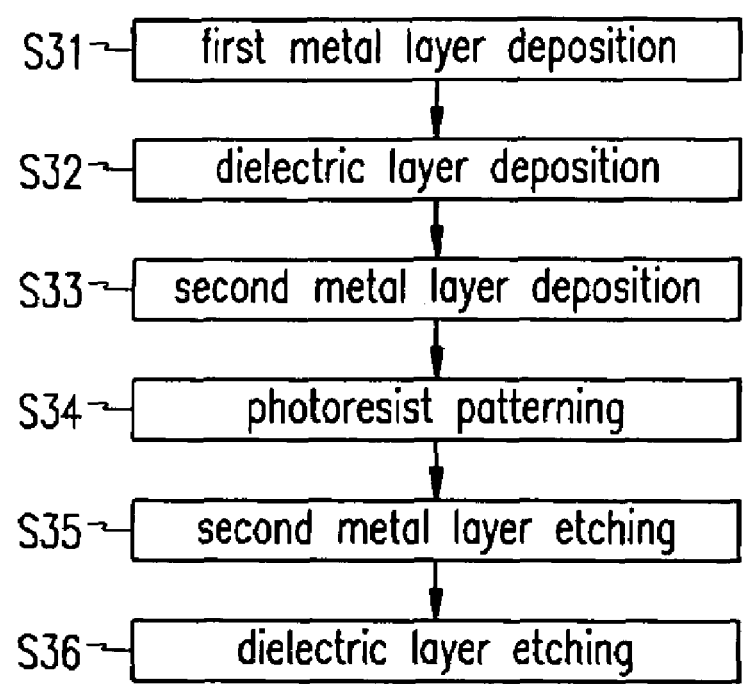
FIG. 3 is a flow chart depicting an example metal reactive ion etching process for forming an even residual nitride film.

FIG. 3 is a flow chart illustrating a metal RIE process for forming a residual even nitride film. As shown in FIG. 3, a process for etching the dielectric layer in the MIM structure is performed in order of first metal layer deposition (S31), dielectric layer deposition (S32), second metal layer deposition (S33), photoresist film patterning (S34), second metal layer etching (S35) and dielectric layer etching (S36).

First, Ti/TiN, AlCu and Ti/TiN stacking metal layers corresponding to the first metal layer are deposited at a thickness of about 5,000 Å, using a sputtering process or the like.

Next, the nitride film (PE-SiN), which is the dielectric layer functioning as the capacitor, is deposited at a thickness of about 600 Å. Here, the thickness of the dielectric layer need not be limited as 600 Å, but instead may be 400 to 800 Å.

Next, Ti/TiN film as the second metal layer is formed on the top of the nitride film, with Ti and TiN deposited at thicknesses of 500 Å and 1500 Å, respectively. At this time, the thicknesses of Ti and TiN need not be limited to the above-mentioned values, but the thickness of Ti can be 300 to 700 Å, the thickness of TiN can be 1300 to 1700 Å, and, consequently, a total thickness of the second metal layer can be 1600 to 2400 Å.

Next, after a photoresist film is applied at a thickness of 11,000 to 15,000 Å on the top of the second metal layer, a photoresist pattern is formed by selectively etching the photoresist film.

Next, using the photoresist pattern as a mask, a metal RIE is performed under the following conditions. First, as etching conditions of Ti/TiN as the second metal layer, a source of 8 mT/900W and a bias power of 150w are used and a plasma of a mixture of $50Cl_2/10CHF_3/50Ar$ is applied as a reactive gas. The second metal layer is etched for about 45 to 55 seconds, preferably, about 50 seconds.

In this step, it is important to remove nitride residues using $CHF_3$. Although the etching process for the second metal layer is performed by $Cl_2$, $CHF_3$ is additionally used to protect a side wall of Ti/TiN film and remove nitride interfacing with Ti to some degree, and Ar is used to improve uniformity.

When the etching for Ti/TiN as the second metal layer is completed, the etching conditions for the nitride film is changed to a source of 8 mT/900W, a bias power of 150W and a reactive gas of $50Cl_2/100Ar$. The nitride film is etched for about 4.5 to 8 seconds, preferably, about 6 seconds In this step, residual metal is removed using $Cl_2$ without using $CHF_3$. This is because the MIM characteristic is deteriorated due to an over-etching of the nitride film if the CHF3 is used in this step. In addition, in this step, a ratio of $Cl_2$ to Ar is 1:2.

This allows effective removal of metal residues and improvement of uniformity. On the other hand, time required for this step is set as 10 to 15% of the etching time of the upper metal layer. This is the most pertinent time in considerations of a pertinent thickness of residual nitride and the removal of the metal residues. On the other hand, a bias power used for the etching is set as more than 150 W.

According to the above-described etching process, the nitride film can be evenly etched, which results in improvement of the MIM characteristic, increased stability of processes in a metal etching, and increased process margin for subsequent processes.

As set forth in the above-described examples, a method for fabricating a capacitor in an MIM (metal/insulator/metal) structure includes a first metal layer, a dielectric layer, and a second metal layer wherein the second metal layer and the dielectric layer are etched in order, and etching conditions of the second metal layer are different from those of the dielectric layer.

Preferably, the second metal layer and the dielectric layer are etched by an RIE (reactive ion etching) process.

Preferably, the dielectric layer remains when the dielectric layer is etched, and a surface of the remaining dielectric layer is even.

Preferably, in the step of etching the second metal layer, the second metal layer is etched using a mixture gas consisting of $Cl_2$, $CHF_3$ and Ar, and, in the step of etching the dielectric layer, the dielectric layer is etched using a mixture gas consisting of $Cl_2$ and Ar.

Preferably, the second metal layer includes Ti and TiN stacked in order, a thickness of Ti is 300 to 700 Å, a thickness of TiN is 1300 to 1700 Å, consequently, a total thickness of the second metal layer is 1600 to 2400 Å.

Preferably, the dielectric layer is made of nitride and a thickness of the dielectric layer is 400 to 800 Å.

Preferably, the first metal layer comprises a first Ti/TiN stacking structure, an AlCu layer, a second Ti/TiN stacking structure, which are formed in order.

Preferably, in the step of etching the second metal layer, the second metal layer is etched for 45 to 55 seconds using a mixture gas consisting of $Cl_2$, $CHF_3$ and Ar in the ratio of 5:1:5, a plasma is generated under the conditions of a pressure of 8 mTorr and an application power of 900 W, and a bias power of more than 150 W is applied.

Preferably, in the step of etching the dielectric layer, the dielectric layer is etched for 10 to 15% of the etching time of the second metal layer, for example, 4.5 to 8 second, using a mixture gas consisting of $Cl_2$ and Ar in the ratio of 1 to 2.

Preferably, in the step of etching the dielectric layer, a plasma is generated under the conditions of a pressure of 8 mTorr and an application power of 900W and a bias power of more than 150 W is applied.

Preferably, before the second metal layer is etched, a photoresist pattern is formed on the second metal layer, the second metal layer and the dielectric layer are etched using the photoresist pattern as a mask. In addition, preferably, a thickness of the photoresist pattern is 11,000 to 15,000 Å.

Preferably, in the steps of etching the second metal layer and the dielectric layer, the same bias power is applied.

Although example embodiments have been described in detail, it should be clearly understood that this patent covers all methods, apparatus and articles of manufacture fairly falling within the scope of the appended claims either literally or under the doctrine of equivalents.

What is claimed is:

1. A method for fabricating a capacitor in a metal/insulator/metal structure including a first metal layer, a dielectric layer comprising a nitride, and a second metal layer comprising Ti and TiN in order, the method comprising:

forming a photoresist pattern on the second metal layer;
   etching the second metal layer with a gas mixture consisting essentially of $Cl_2$, $CHF_3$ and Ar in a ratio of 5:1:5, using the photoresist pattern as a mask; and
   etching the dielectric layer with a gas mixture consisting essentially of $Cl_2$ and Ar in a ratio of 1 to 2, using the photoresist pattern as the mask, to leave a residual dielectric layer over the first metal layer in an etched part of the dielectric layer.

2. The method of claim 1, wherein etching the second metal layer comprises a first reactive ion etching process, and etching the dielectric layer comprises a second reactive ion etching process.

3. The method of claim 1, wherein a thickness of the Ti is 300 to 700Å and a thickness of the TiN is 1300 to 1700Å.

4. The method of claim 1, wherein a total thickness of the second metal layer is 1600 to 2400Å.

5. The method of claim 1, wherein a thickness of the dielectric layer is 400 to 800Å.

6. The method of claim 1, wherein the first metal layer comprises a first Ti/TiN stack, an AlCu layer and a second Ti/TiN stack in order.

7. The method of claim 1, wherein, etching the second metal layer comprises etching the second metal layer for 45 to 55 seconds.

8. The method of claim 1, wherein etching the second metal layer comprises generating a plasma at a pressure of 8 mTorr and a power of 900 W and applying a bias power of more than 150 W.

9. The method of claim 1, wherein an etching time associated with the dielectric layer is between about 10 to 15% of an etching time associated with the second metal layer.

10. The method of claim 1, wherein etching the dielectric layer comprises etching the dielectric layer for 4.5 to 8 seconds.

11. The method of claim 1, wherein etching the dielectric layer comprises generating a plasma is generated under a pressure of 8 mTorr and an application power of 900 W and applying a bias power of more than 150 W.

12. The method of claim 1, wherein a thickness of the photoresist pattern is 11,000 to 15,000Å.

13. The method of claim 1, wherein the dielectric layer comprises silicon nitride.

14. The method of claim 1, wherein the residual dielectric layer comprises a continuous residual dielectric layer over the first metal layer.

* * * * *